United States Patent [19]

Chandrashekhar et al.

[11] 4,264,813
[45] Apr. 28, 1981

[54] HIGH INTENSITY ION SOURCE USING IONIC CONDUCTORS

[75] Inventors: G. V. Chandrashekhar, Mahopac; Praveen Chaudhari, Briarcliff Manor; Jerome J. Cuomo, Lincolndale; Richard J. Gambino; James M. E. Harper, both of Yorktown Heights, all of N.Y.

[73] Assignee: International Business Machines Corportion, Armonk, N.Y.

[21] Appl. No.: 53,590

[22] Filed: Jun. 29, 1979

[51] Int. Cl.³ .................. B01D 59/44; H01J 27/00
[52] U.S. Cl. .................................. 250/288; 250/359; 250/423 R
[58] Field of Search ............ 313/359; 250/423, 423 R, 250/359, 288

[56] References Cited

U.S. PATENT DOCUMENTS

| | | | |
|---|---|---|---|
| 2,970,215 | 1/1961 | Spacil | 250/288 |
| 3,096,456 | 7/1963 | Shelton | 313/63 |
| 3,117,416 | 1/1964 | Harries | 60/35.5 |
| 3,233,404 | 2/1966 | Huber et al. | 60/35.5 |
| 3,336,475 | 8/1967 | Kilpatrick | 250/423 |
| 3,354,644 | 11/1967 | Moore | 60/202 |
| 3,371,489 | 3/1968 | Eckhardt | 60/202 |
| 3,382,397 | 5/1978 | Zalm | 313/230 |
| 3,523,210 | 8/1970 | Ernstene et al. | 315/111 |
| 3,612,941 | 10/1971 | Nablo | 313/310 |
| 3,617,789 | 11/1971 | Middleton | 312/63 |
| 3,852,595 | 12/1974 | Aberth | 250/288 |

*Primary Examiner*—Harold A. Dixon
*Attorney, Agent, or Firm*—Michael J. Weins

[57] ABSTRACT

The present invention describes an ion source which is capable of producing relatively high density ion currents. The ion source employs an electrically biased ionic conductor to supply ions from a reservoir of the atomic species.

3 Claims, 2 Drawing Figures

HIGH INTENSITY ION SOURCE USING IONIC CONDUCTORS

DESCRIPTION

1. Technical Field

The present invention relates to an ion source and more particularly to an ion source employing ionic conductors to provide a high intensity flux of ions.

2. Background Art

Plasma devices have been frequently used in the past as ion sources. In general, the plasma is generated by the interaction of an electron beam with a low pressure gas creating an ionized plasma. An electric field is employed to extract ions from the plasma and accelerate them towards the surface to be bombarded. While this technique will allow one to obtain a high intensity ion current over a limited area as the area exposed by the beam is increased and the ion current density usually decreases. Therefore in plasma ion devices there is generally a tradeoff between intensity of the ion current and the surface area exposed. A further limitation of plasma devices is that there is a considerable ion to ion variation in the kinetic energy of the emitted ions. This energy spread is undesirable for many applications.

Surface activated devices have also been used to produce ion beams. These devices produce ions when a liquid or gas flows across an active surface which promotes ionization of the liquid or gas. These surfaces generally require heating to promote ionization and may require coating with a catalyst. One such surface activated device is described by W. D. Kilpatrick in U.S. Pat. No. 3,364,075. He teaches forming negative ions from an iodine gas by contacting it with a lanthanum boride surface.

Frequently, porous tungsten plugs are used as activating surfaces which ionize a gas as it passes through the plug. R. D. Moore in U.S. Pat. No. 3,354,644 teaches using a heated porous tungsten plug as an ionizer. The current density of surface activated ion sources will be determined by the flow of the gas over the activity surface. For porous plugs the flow will be a function of the pressure drop through the porous material. The ultimate strength of the ion source will be a function of the pressure differential maintained through the porous material. In general, these porous plug devices are limited to current densities in the neighborhood of 30 mA/cm$^2$.

Surface activation devices have also been constructed using capillary tubes rather than porous materials. Harry Huber et al in U.S. Pat. No. 3,233,404 teaches the use of a refractory metal capillary tube to ionize a gas as it passes through. The tube must be heated to an elevated temperature to make its surface active. They report that heating a single tantalum tube 0.4 mm in diameter and 10 mm in length to 2100° K. while feeding cesium gas through the tube will produce ion current densities in the order of 1 A/cm$^2$. This device produces a very intense ion current but the ion current acts over a very limited area. While it is possible to increase the exposed area by employing an array of tubes it will be difficult to maintain the current density due to the intercapillary separation and difficulties in maintaining the array of capillary tubes at temperature.

As is the case with the porous plug devices the ultimate strength will be a function of the pressure drop through the capillary opening. This places another limitation on both capillary devices and the porous plug devices. Since their ion output is limited by the pressure difference across the device when they are operated between two fixed pressures the ion output of the device will be fixed.

DISCLOSURE OF INVENTION

It is an object of the present invention to provide an ion source capable of producing high current densities.

Another object of the invention is to provide an ion source where the ion current output and ion energy can be independently adjusted over a broad range.

Still another object of this invention is to provide ions where the ion to ion variation in the kinetic energy is small.

A further object of this invention is to provide an ion source for producing a uniform flux where there will be few constraints placed on the area or shape of the source.

Yet, another object of this invention is to provide an ion source that will discriminate in the species that it will ionize from a reservoir.

Still another object of this invention is to provide an ion source that can produce either positive or negative ions.

These and other objects of this invention will become more apparent from the study of the device herein described.

The device is an ion generator which has a reservoir containing the atomic species. Adjacent to the reservoir is an ionic conductor which contacts the atomic species. Means for maintaining an electric field through the ion conductor are employed to develop an ion flux.

When an ion beam is sought for bombarding a target the ion source is employed with a vacuum chamber. The ion source has a reservoir containing the atomic species to be ionized. Adjacent to the reservoir is an ionic conductor having a first side and a second side which are spaced apart. The first side of the ion conductor contacts the atomic species while the second side communicates with the vacuum chamber. The target, located in the vacuum chamber, is separated from the second surface of the ion conductor. A voltage source serves as means for maintaining an electric field through the ion conductor. It is electrically connected to a first electrode containing the atomic species and is also electrically connected to the target. The field is maintained by holding the first electrode at a different potential than the target which creates an electric field that accelerates the ions as they pass through the conductor and through the separation between the ion conductor and the target.

BEST MODE FOR CARRYING OUT THE INVENTION

Figure 1:
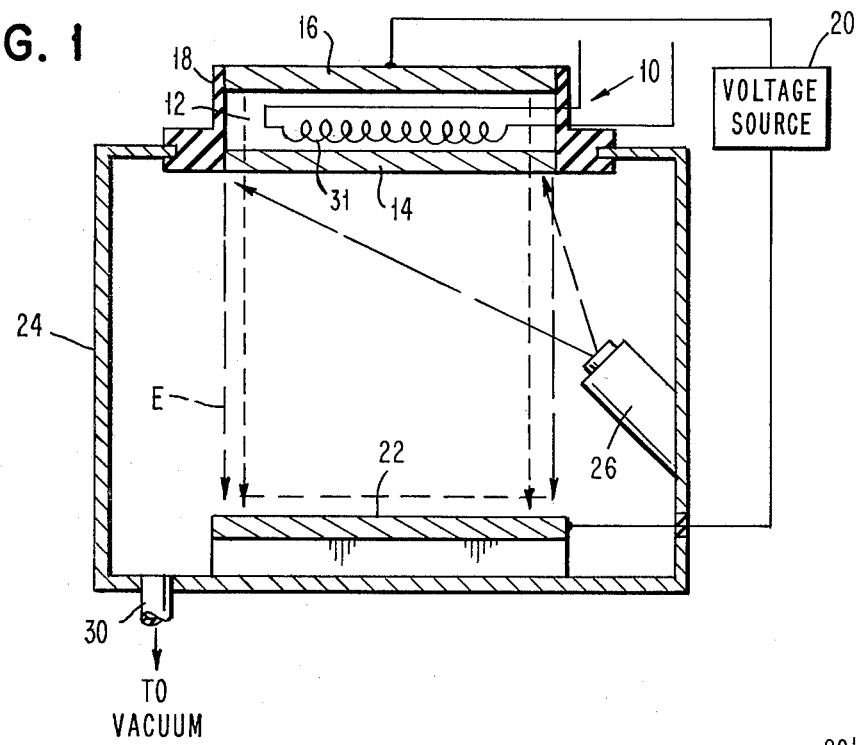
FIG. 1 illustrates one embodiment of the invention where the ion generator is employed as an ion source to bombard a target.

The present invention will be discussed in references to FIG. 1 and FIG. 2. FIG. 1 illustrates one embodiment of the invention where the ion generator is employed as an ion source producing ions which bombard a target.

The ion generator 10 has a closed reservoir 12 which is bounded by an ionic conductor 14, and an electrode 16 spaced apart from the ionic conductor 14, and nonconducting walls 18 completing the enclosure of the reservoir 12. The nonconductive wall 18 will allow one to maintain an electrical potential between the electrode 16 and the ion conductor 14. Typically, the electrode 16 will be made of a material such as metal, semiconductor, or ionic conductor. When the reservoir 12 is so configured, it is well suited to contain atomic species to be ionized in either liquid or gaseous state. Since the ionic conductor 14 forms a wall of the reservoir 12, the ionic conductor is in contact with the atomic species to be ionized.

The ionic conductors used in the practice of this invention are rigid materials which conduct electricity primarily by the motion of ions rather than electrons. The ions may be positively or negatively charged atoms or combinations of atoms (e.g. molecular ions) bearing unit or multiple charge. Some examples of ionic conductors useful in the practice of this invention are:

a. single crystals of solids such as beta-alumina in which electrical current is carried by one ion species which moves under the influence of an electric field through the crystalline structure;

b. solid polycrystalline aggregates which conduct electricity by the transport of ions either through the crystalline grains or along grain boundaries;

c. amorphous, glassy or noncrystalline solids which support an electric current by ion transport; and d. solid porous, electrically insulating body having interconnected pores which contain liquids, such as molten salts which conduct electricity primarily by the transport of ions.

In the latter case, the pore volume of the body must be a sufficiently small fraction of the total volume that the body retains its structural integrity under a pressure differential of about one atmosphere. In common practice a ceramic body with less than 25% pore volume is suitable.

When a field E is applied through the ionic conductor the ions are accelerated. A voltage source 20 is applied between the electrode 16 and a target 22 providing means for maintaining an electric field E through the ionic conductor 14.

In order to assure launching of ions from the ionic conductor 14 and to assure they are not interrupted enroute to the target 22, it is desirable to place the target 22 in an evacuated chamber 24 which communicates with the ion generator 10. When the pressure in the vacuum chamber 24 is preferably below approximately $10^{-3}$ torr, a high density flux of ions will be field emitted from the ionic conductor 14 and impinge on the target 22.

The flux can be augmented by bombarding the surface of the ionic conductor 14 with ions from plasma source 26. This bombardment would enhance the ion yield from the ionic conductor 14 by the process of physical sputtering. The increase in the pressure caused by the ions introduced by the ion plasma source 26 can be controlled by continuously evacuating the chamber 24 through the outlet 30.

The flux can also be augmented by heating the ion source 14. This produces thermionic emission as well as increasing the ionic conductivity. By proper selection of the temperature, it is possible to control the ion output.

Figure 2:
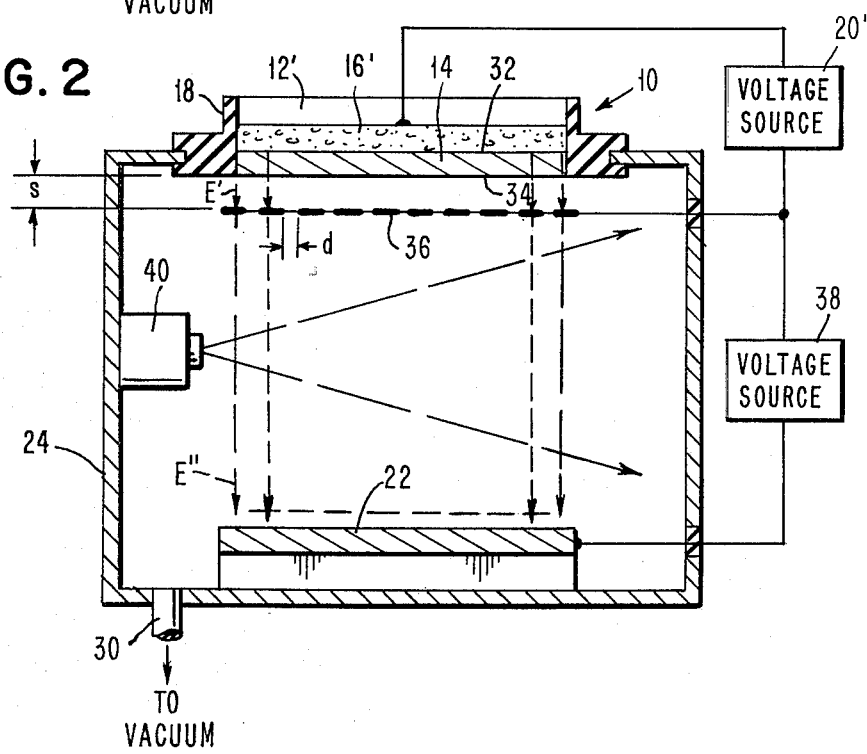
FIG. 2 illustrates a second embodiment of the invention where the ion generator operates with a liquid supply and produces a beam for bombarding a target.

A second embodiment of the invention is illustrated by FIG. 2. The ion generator 10 is designed to work with a liquid which supplies the atomic species. The reservoir 12' contains a liquid and may be an open reservoir as shown in FIG. 2. The ionic conductor 14 forms one of the walls of the reservoir. The remaining walls 18 are preferably nonconducting. The ion conductor 14 has a first surface 32 in contact with the atomic species. A second surface 34 of the ionic conductor 14 which is spaced apart from the first surface 32 communicates with the vacuum chamber 24 and the target 22.

The first electrode 16' contacts the atomic species. When the electrode 16' is of a porous material, it may also contact the ion conductor and still permit the atomic species to communicate with the ionic conductor 14. Alternatively, it may be spaced apart from the ionic conductor 14 as is illustrated by the electrode 16 in FIG. 1.

In some cases, having the electrode 16' in contact with the ionic conductor 14 will assist in the transfer of the ions from the reservoir 12 to the ionic conductor. For example, if the ionic conductor is $ZrO_2$, CaO or $Y_2O_3$ stabilized and the reservoir 12 contains $O_2$ gas, a porous Pt electrode at the $ZrO_2/O_2$ interface greatly improves the transport through the ionic conductor 14.

A second electrode 36 is separated from, but closely spaced to the second surface 34 of the ionic conductor 14. The second electrode 36 is preferably a wire mesh having an inter-wire space d which is small with respect to the spacing s between second electrode 36 and ionic conductor 14. The voltage source 20' maintains a potential difference between the second electrode 36 and the first electrode 16'. This potential difference provides an electric field E' through the ionic conductor 14. The polarity of the source will depend upon whether positive or negative ions are being transmitted through the ionic conductor 14.

A second voltage supply 38 maintains a potential difference between the second electrode 36 to the target 22. This potential creates a supplementary electric field E''. When the field E' and the supplementary field E'' have the same polarity the supplementary field E'' further accelerates the ions as they move from the second electrode 36 to the target 22.

Since the present invention as described in FIG. 2 is capable of producing a beam with very large ion currents the individual charge on the ions can create a space charged beam which causes the beam to spread.

In order to prevent beam spreading, it is preferred to employ some means to neutralize the space charge effect. This may be a hollow cathode neutralizer 40 such as that described in "Advances In Electronics And Electron Physics", 36, 265 (1974) by H. R. Kaufman.

Alternatively, other means known in the art such as the thermionic filaments described in the Kaufman article may be used to neutralize space charge.

In order to further one's appreciation for the current densities that are obtainable with the above-described ion generator, tests were conducted using $Na^+\beta$-alumina as the ionic conductor and an eutectic melt of $NaNO_3$ and $NaNO_2$ as the source for sodium. A fiber mat soaked in the eutectic melt served as the reservoir. The mat was contacted by a $Na^+\beta$-alumina crystal and a gold electrode. A second gold electrode served as the target and was spaced apart from the ionic conductor by approximately 3.5 mm. The electrodes, ionic conductor, and the fiber soaked mat were placed in a vessel which was evacuated to about $\sim 10^{-3}$ to $10^{-4}$ torr and heated to 300° C. Thereafter, a potential of 500 V was applied between the two electrodes. The electrode in contact with the eutectic melt was maintained at the higher potential. Under these conditions a current density of 100 mA/cm$^2$ was obtained. This current is substantially above the typical value of 30 mA/cm$^2$ obtained from ion sources employing porous plugs.

While the above example employs Na$^+$ $\beta$-alumina ionic conductor to Na$^+$ ions, the type of ion which can be generated may be varied by the proper selection of the ionic conductor and an appropriate atomic species for the reservoir.

The following test may be used to determine if a material is an ionic conductor suitable for the practice of this invention. The material to be tested is fabricated into a shape having a first flat side and a second flat side which are parallel. A liquid or gas containing the atomic species to be ionized is placed in contact with the first flat parallel side of the material. Two chemically inert, electrically conductive electrodes (e.g. gold sheets) are employed to test the material and one electrode contacts the second flat parallel side of the material. The second electrode contacts the liquid or gas. An electric field is imposed on the test material by polarizing the electrodes. The electric current flowing during the test and the time of the test are monitored and recorded. At the end of the test the electric field is removed and the number of gram equivalents of the material transported from the ion source to the electrode on the opposite side of the test material is measured.

A quality factor, R, of the material can be computed by dividing the number of gram equivalents transported by the total number of faradays passed through the test material. The number of faradays is the current in amperes (coulombs per second) multiplied by the time the current flowed in seconds and divided by $9.6 \times 10^4$. If R is close to unity, the material is an ionic conductor, that is, the electric current through the material is carried primarily by ion transport. The material is useable as an ionic conductor in the practice of this invention if R is greater than 0.2.

The ion current density, J, can also be determined in this test if the cross sectional area of the test material is measured. The value of J is the product of R times the current, divided by the area. A useful ionic conductor is one which will support an ion flux of at least $10^{15}$ ions per cm$^2$ per second. For ions bearing unit charge, this corresponds to a J value of at least $1.6 \times 10^{-4}$ amps/cm$^2$. The values of both R and J are strongly dependent on temperature so that a given material may be a useful ionic conductor at an elevated temperature but not at room temperature.

Some typical ionic conductors which are well suited for the particular application are set forth in Table I.

TABLE I

| Ion Source Systems Using Ionic Conductors | | | | |
|---|---|---|---|---|
| Ion | Ionic Conductor | Conductivity $(\Omega \text{ cm})^{-1}$ | Operating Temperature C.° | Contents of Reservoir |
| O$^-$ | ZrO$_2$ (Y$_2$O$_3$ stabilized) | $7.6 \times 10^{-2}$ | 1,000 | O$_2$ gas with a porous Pt electrode |
| Li$^+$ | Li$_3$N | $1.5 \times 10^{-1}$ | 450 | Molten Li metal |
| | LiOH | $10^{-2}$ | 400 | Molten Li metal |
| F$^-$ | KBiF$_4$ | $4 \times 10^{-3}$ | 100 | Molten KHF$_2$ |
| | | $2 \times 10^{-1}$ | 300 | |
| I$^-$ | KAg$_3$I$_4$ | $\sim 10^{-2}$ | $\sim 100$ | KI-I$_2$ eutectic |
| Na$^+$ | Na$^+$ $\beta$-alumina | $2 \times 10^{-1}$ | 300 | NaNO$_3$-NaNO$_2$ eutectic |

TABLE I-continued

| Ion Source Systems Using Ionic Conductors | | | | |
|---|---|---|---|---|
| Ion | Ionic Conductor | Conductivity $(\Omega \text{ cm})^{-1}$ | Operating Temperature C.° | Contents of Reservoir |
| | | | | eutectic |

Each of the ionic conductor source systems set forth in Table I have special uses depending on the ions generated. These uses may also depend on the purpose of the ion bombardment and the nature and composition of the target material. For example, O$^-$ is a very reactive ion. When it is used to bombard a metal, e.g., Al, Ta, Nb, Pb, or a semiconductor such as Si, Ge, or GaAs, it is possible to form an oxide layer on these materials. The oxide formed in this manner is useful for corrosion protection, or as an electrically insulating layer. If the target material forms volatile oxides, e.g., carbon which forms CO and CO$_2$ under O$^-$ bombardment, the oxygen ion beam can be used for Ion Assisted Chemical Etching (IACE). For example, organic compounds or other carbonaceous residues can be removed from oxide substrates by low energy O$^-$ bombarding.

Another application of ion bombardment is the doping of semiconductors. The ion for this application must be capable of altering the electrical properties of the target semiconductor. For example, Li can be implanted into Si to increase its conductivity. The ionic conductor source system has the advantage that very low energy ions can be used to produce very shallow implants for surface doping. Also, only the desired dopant will be implanted because the ionic conductor is highly selective for the desired ion species so that unwanted impurities are rejected.

For some ion assisted chemical etching (IACE) applications F$^-$ is a particularly effective ion. For example, silicon forms a volatile fluoride SiF$_4$, and under F$^-$ bombardment the Si will be etched rapidly. When fabricating silicon devices it is often necessary to remove Si from selected areas without removing Si from other portions of the device. The high etch rate of Si in a beam of F$^-$ ions can be used to selectively etch only those portions of the device where Si is exposed to the beam.

Some processes for forming permeable plastic films depend on the creation of heavy ion damage tracks in the material. The damage tracks can be created by bombarding the surface with high energy heavy ions. The damaged regions are subsequently etched away by a selective chemical etching technique to provide passages through the film. These films are useful as micro filters. An example of a heavy ion suitable for this application is I$^-$ which can be obtained from a KAg$_3$I$_4$ ionic conductor source system.

Ions with low electro-negativity, e.g., Na$^+$, can be used to produce a high yield of negative ions in secondary ion mass spectrographic (SIMS) analysis. When analyzing for certain constituent elements in a test sample, the detection sensitivity is low, under Ar$^+$ or O$_2^+$ sputtering because, the yield of ions is very low. By using a Na$^+$ beam it is possible to greatly improve the detection sensitivity for some of these elements because Na$^+$ produces a large yield of negative ions that can be detected in the mass spectrograph.

INDUSTRIAL APPLICATION

The ion beam source of the present invention is well suited to a variety of industrial applications. Particularly, likely applications would be the semiconductor industry, the material processing industry and material testing industry.

The electronics and in particular the semiconductor industry uses ion sources for sputter deposition, sputter etching, ion assisted and chemical etching. These techniques are extensively used in fabrication of electronic devices. The electronics industry also employs ion beams for ion implantation, for doping and for creating damaged regions to modify the surface properties of the resulting device.

The material processing industry uses ion beams for producing permeable plastic films, by generating ion tracks in the films which when etched provide passages through the films; to treat the surface of metals by ion bombardment creating an amorphous layer on the surface which increases corrosion resistance; and to implant ions at and near the surface to change the chemical composition altering the physical properties of the material.

The testing industry employs ion beams to selectively remove layers of a material for analysis. These layers can be individually studied allowing profiles of the variations in the chemical composition to be developed.

While the novel features of the invention have been described in terms of preferred embodiments and in particular industrial applications, it will be appreciated that various omissions and substitutions or other applications may be made by those skilled in the art without departing from the spirit of the invention.

Having thus described our invention, what we claim as new, and desire to secure by Letters Patent is:

1. An ion beam generator which generates ions from an atomic species for bombarding a target in a vacuum chamber comprising:
   a reservoir containing the atomic species;
   an ionic conductor having a first surface and a second surface wherein said first surface is adjacent to said reservoir and is in contact with said atomic species and said second surface communicates with the target;
   a first electrode contacting said atomic species;
   a voltage supply connected to said first electrode and the target to maintain a potential difference between said first electrode and the target to create an electric field which accelerates the ions as they pass through said ion conductor;
   a second electrode connected to said voltage supply, positioned between said ion source and said target, and maintained at a potential between said first electrode and said target;
   a supplemental voltage supply connected in series with said voltage supply and being so interposed as to maintain a potential difference between said second electrode and said target.

2. The ion beam generator of claim 1 further comprising a means to heat said ionic conductor.

3. The ion beam generator of claim 2, further comprising:
   means for neutralizing the space charge of said ion beam to prevent spreading of said ion beam.

* * * * *